(12) United States Patent
Tanaka et al.

(10) Patent No.: US 7,295,588 B2
(45) Date of Patent: Nov. 13, 2007

(54) SEMICONDUCTOR LASER ELEMENT, METHOD OF FABRICATION THEREOF, AND MULTI-WAVELENGTH MONOLITHIC SEMICONDUCTOR LASER DEVICE

(75) Inventors: Akira Tanaka, Kanagawa (JP); Hideo Shiozawa, Kanagawa (JP); Minoru Watanabe, Tokyo (JP); Koichi Gen-Ei, Chiba (JP); Hirokazu Tanaka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 10/724,570

(22) Filed: Nov. 26, 2003

(65) Prior Publication Data
US 2004/0156408 A1  Aug. 12, 2004

(30) Foreign Application Priority Data
Nov. 29, 2002 (JP) .............................. 2002-349033

(51) Int. Cl.
*H01S 5/00* (2006.01)
(52) U.S. Cl. .................................. 372/46.01; 372/43.01
(58) Field of Classification Search ........... 372/50.121, 372/50.122, 46.01, 43.01
See application file for complete search history.

(56) References Cited

U.S. PATENT DOCUMENTS 5,701,322 A * 12/1997 Nagai ....................... 372/46.01
5,822,348 A * 10/1998 Fujii ........................ 372/45.01
6,031,858 A *  2/2000 Hatakoshi et al. ........ 372/46.01
6,266,354 B1 *  7/2001 Chino et al. ............. 372/43.01
6,400,742 B1 *  6/2002 Hatakoshi et al. ........ 372/46.01
6,757,311 B2 *  6/2004 Abe ........................ 372/43.01
2001/0043632 A1* 11/2001 Ohya et al. .................... 372/45

* cited by examiner

*Primary Examiner*—Minsun Oh Harvey
*Assistant Examiner*—Tod T. Van Roy
(74) *Attorney, Agent, or Firm*—Hogan & Hartson LLP

(57) ABSTRACT

The present invention provides a semiconductor laser element, a method of fabrication thereof, and a multi-wavelength monolithic semiconductor laser device that achieve self-sustained pulsation up to a high output level and achieve self-sustained pulsation over a wide output range. A semiconductor laser element that exhibits self-sustained pulsation in a predetermined output region, said semiconductor laser element comprising: a substrate; a first conductive type clad layer formed on said substrate; an active layer formed on said first conductive type clad layer for emitting light by current injection; a second conductive type first clad layer formed on said active layer; and a stripe-shaped second conductive type second clad layer formed on said second conductive type first clad layer in a first direction, in such a manner that the cross-sectional surface of said stripe-shaped second conductive type second clad layer in a direction perpendicular to said first direction has a shape having an upper edge and a lower edge that face each other and side edges that connect between said upper edge and said lower edge, where the minimum width thereof is at least 70% but no more than 100% of the maximum width.

2 Claims, 8 Drawing Sheets

US 7,295,588 B2

SEMICONDUCTOR LASER ELEMENT, METHOD OF FABRICATION THEREOF, AND MULTI-WAVELENGTH MONOLITHIC SEMICONDUCTOR LASER DEVICE

CROSS-REFERENCE TO RELATED APPLICATIONS

This application is based upon and claims the benefits of priority from the prior Japanese Patent Application No. 2002-349033, filed on Nov. 29, 2002, the entire contents of which are incorporated herein by reference.

BACKGROUND OF THE INVENTION

1. Field of the Invention

The present invention relates to a semiconductor laser element, a method of fabrication thereof, and a multi-wavelength monolithic semiconductor laser device.

2. Related Background Art

It is becoming popular to develop an integrated optical unit assembled from a semiconductor laser of a wavelength in the 650-nm band for digital versatile disks (DVDs) and another semiconductor laser of a wavelength in the 780-nm band for CD-ROMs. The development is also proceeding of a two-wavelength monolithic semiconductor laser device in which these two lasers are formed monolithically on the same substrate. To ensure that this two-wavelength monolithic semiconductor laser device can be used for both CDs and DVDs, it is necessary to reduce noise by producing a longitudinal multi-mode. To achieve this multi-mode operation, a method of providing an external oscillation circuit has been used. However, there has recently been progress in the development of self-sustained pulsation lasers that can achieve multi-modes by self-sustained pulsation, without an external oscillation circuit, as disclosed in Japanese Patent Application Laid-Open No. 6-13709, for example.

A prior-art example of a two-wavelength monolithic semiconductor laser device B that is capable of self-sustained pulsation is shown in FIG. 8. A laser element C on the left side of this figure is an element for CDs in which an active layer 3 is formed of an AlGaAs compound material and a laser element D on the right side of the figure is a laser element D for DVDs in which an active layer 24 is formed of an InGaAlP compound material.

The laser element C for CDs on the left side of the figure is formed of an n-type clad layer 2 of $Al_{0.4}Ga_{0.6}As$, the active layer 3 of $Al_{0.12}Ga_{0.88}As$, and a p-type first clad layer 4 of $Al_{0.4}Ga_{0.6}As$, in sequence on an n-type GaAs substrate 1. A p-type second clad layer 5 is formed of $Al_{0.4}Ga_{0.6}As$ in the shape of a stripe (a ridge shape) on part of this p-type first clad layer 4. The cross-sectional surface of this ridge-shaped p-type second clad layer (ridge portion) 5 is a quadrilateral such that the width of the upper edge is less than the width of the lower edge, as shown in FIG. 8. This p-type second clad layer 5 is provided to a thickness of 1 μm in order to efficiently confine light into the active layer 3. To prevent the generation of high-order modes, the width thereof is no more than approximately 4 μm. A p-type contact layer 6 is formed of GaAs on this ridge portion 5.

The laser element D for DVDs on the right side of the figure, on the other hand, is formed of a buffer layer 21 of n-type GaAs, an n-type clad layer 22 of $In_{0.5}(Ga_{0.3}Al_{0.7})_{0.5}P$, an n-side guide layer 23 of $In_{0.5}(Ga_{0.5}Al_{0.5})_{0.5}P$, the active layer 24 of a multiple quantum well (MQW) structure of InGaP/InGaAlP, a p-side guide layer 25 of $In_{0.5}(Ga_{0.5}Al_{0.5})_{0.5}P$, a p-type first clad layer 26 of $In_{0.5}(Ga_{0.3}Al_{0.7})_{0.5}P$, and an etching-stopping layer 27 of p-type $In_{0.5}Ga_{0.5}P$, in sequence on the same n-type GaAs substrate 1. A p-type second clad layer 28 is formed of p-type $In_{0.5}(Ga_{0.3}Al_{0.7})_{0.5}P$ in the shape of a ridge on part of this etching-stopping layer 27. This ridge-shaped p-type second clad layer 28 has an Al composition of greater than 0.7 and thus a larger band gap, in order to efficiently seal light into the active layer 24. The p-type second clad layer 28 is provided to a thickness of 1 μm in order to efficiently confine light into the active layer 24. To prevent the generation of high-order modes, the width thereof is no more than approximately 4 μm. A p-type contact layer 30 is formed of GaAs on this ridge-shaped p-type second clad layer 28.

The ridge portions 5 and 28 of the elements C and D on either side of FIG. 8 are covered by $SiO_2$ films 29C and 29D. A p-side electrode 42 and an n-side electrode 41 are formed at the top and bottom of both of the elements C and D, and a separation groove 43 is formed between the two elements C and D. Currents are injected to the active layers 3 and 24 of the respective elements C and D from the n-side electrode 41 and the p-side electrodes 42. A laser beam of the 780-nm band is emitted from the vicinity of the active layer 3 of the semiconductor laser element C for CDs on the left side of the figure and a laser beam of the 650-nm band is emitted from the active layer 24 of the semiconductor laser element D for DVDs on the right side of the figure.

The method of fabricating the device B is given below. First of all, a stack of the layers 2 to 6 is formed over the entire surface of the n-type GaAs substrate 1 of AlGaAs compound materials. The assembly is then etched down to partway through the n-type GaAs substrate 1, to remove the portion indicated by broken lines in the figure. A stack of the layers 21 to 28 and 30 is then formed by a second crystal growth process of InGaAlP compound materials, in the etched portion. A stripe-shaped oxide film is then formed in a region on each of the first crystal growth side (the left side) and the second crystal growth side (the right side). The left and right ridge-shaped waveguide paths 5/6 and 28/30 are formed by etching. The two-wavelength monolithic semiconductor laser device B can be obtained subsequently by removing the oxide films on the waveguide paths 5/6 and 28/30; forming the p-side electrodes 42, the n-side electrode 41, and the separation groove 43; and then forming the $SiO_2$ films 29C and 29D.

The above-described method of fabrication is characterized in that wet etching is used during the formation of the ridge portions 5 and 28 by etching. The use of such wet etching ensures that the crystals of the ridge portions 5 and 28 are not damaged, in comparison with the use of dry etching. This use of wet etching exposes the (111)A surfaces on the sides of the ridge portions 5 and 28 so that the ridge portions 5 and 28 form quadrilaterals in which the width of the upper edge is narrow and the width of the lower edge is wide. With the device of FIG. 8, the shape of the ridge portions 5 and 28 is such that, if the width of the lower edge is approximately 3 μm and the thickness (height) thereof is approximately 1 μm, the width of the upper edge is approximately 1 μm. In other words, the ratio of the width of the upper edge to the width of the lower edge is approximately 35%.

In the self-sustained pulsation laser of the prior art, the active layers 3 and 24 are made to be thick in order to obtain self-sustained pulsation. In addition, the ridge portions 5 and 28 have a shape such that the width of the upper edge is less than the width of the lower edge. However, the upper limit of the output obtained by the self-sustained pulsation is on the order of 4.5 mW, regardless of the thickness of the active layers 3 and 24 and the technique used to form the shapes of the ridge portions 5 and 28. The lower limit is on the order of 3 mW, although there will be some variation between elements. In other words, self-sustained pulsation can be obtained only within the output region of 3 to 4.5 mW with the self-sustained pulsation laser of the prior art.

That is to say, self-sustained pulsation can be obtained only when the output of the laser beam is weak and the active layers 3 and 24 operate as saturable absorber, as disclosed in the above-mentioned Japanese Patent Application Laid-Open No. 6-13709. Thus self-sustained pulsation can be obtained when the absorption in the active layers 3 and 24 exceeds the gain. In such a case, the active layers 3 and 24 of the laser device B of FIG. 8 could be made thicker in order to make it easier for self-sustained pulsation to occur. If the active layers 3 and 24 are made thicker, the confinement of the light into the active layers 3 and 24 will be stronger, making it easier for the active layers 3 and 24 to operate as absorber and thus easier for self-sustained pulsation to occur. More specifically, the thickness of the active layer 3 in the laser for CDs on the left side of the figure should be at least 20 nm. Similarly, the total thickness of the well layers of the active layer 24 in the laser for DVDs should be at least 20 nm. In contrast thereto, to achieve a high output from a high-output laser, the active layer is made thinner so that the confinement of light into the active layer is weakened.

In the laser device shown in FIG. 8, the ridge portions 3 and 28 are shaped so that width of the upper edge of each is no more than 50% of the width of the lower edge thereof. The injection of currents into the active layers 3 and 24 is constrained by the narrowing of the width of the upper edge, the light-generating regions of the active layers 3 and 24 is limited to the central portions under the ridge portions 5 and 28, and the surface area of the portions of the active layers 3 and 24 that produce the high gain is reduced. This is because it is considered in the prior art that absorption by the active layers 3 and 24 can be made more likely to occur and self-sustained pulsation can be made more likely to occur by reducing the surface area of the portions in which gain is high and increasing the surface area of portions in which absorption occurs. And this is because it is easy to form the ridge portions 5 and 28 so that the width of the upper edges thereof are narrow by using wet etching.

As described above, the thicknesses of the active layers 3 and 24 and the shapes of the ridge portions 5 and 28 are manipulated in the self-sustained pulsation laser device of the prior art. However, the upper limit of the output region in which self-sustained pulsation is achieved is restricted to approximately 4.5 mW. But this has been thought to be inevitable, due to the above-described self-sustained pulsation mechanism.

BRIEF SUMMARY OF THE INVENTION

The present inventors have performed various experiments to obtain a self-sustained pulsation laser which achieves self-sustained pulsation to an output that is higher than that of a self-sustained pulsation laser of the prior art, and which exhibits self-sustained pulsation over a wide output range. As a result, they have overturned conventional technological wisdom and have independently determined that it is possible to obtain self-sustained pulsation up to a high output by shaping each ridge portion so that the width of the upper edge is at least 70% of the width of the lower edge and by increasing the width of the upper edge to greater than that in the prior art.

According to embodiments of the present invention, there is provided a semiconductor laser element that exhibits self-sustained pulsation in a predetermined output region, said semiconductor laser element comprising:

a substrate;

a first conductive type clad layer formed on said substrate;

an active layer formed on said first conductive type clad layer for emitting light by current injection;

a second conductive type first clad layer formed on said active layer; and a stripe-shaped second conductive type second clad layer formed on said second conductive type first clad layer in a first direction, in such a manner that the cross-sectional surface of said stripe-shaped second conductive type second clad layer in a direction perpendicular to said first direction has a shape having an upper edge and a lower edge that face each other and side edges that connect between said upper edge and said lower edge, where the minimum width thereof is at least 70% but no more than 100% of the maximum width.

According to embodiments of the present invention, there is provided a method of fabricating a semiconductor laser element that exhibits self-sustained pulsation in a predetermined output region, said method comprising the steps of:

forming a first conductive type clad layer on a substrate;

forming an active layer on said first conductive type clad layer;

forming a second conductive type first clad layer on said active layer;

forming a second conductive type second clad layer on said second conductive type first clad layer;

forming a stripe-shaped oxide film on said second conductive type second clad layer; and using said oxide film as a mask to etch said second conductive type second clad layer to form a stripe-shaped second conductive type second clad layer; wherein:

an upper portion that is at least 60% of the top of said stripe-shaped second conductive type second clad layer is formed by dry etching; and the cross-sectional surface of said stripe-shaped second conductive type second clad layer has an upper edge and a lower edge that face each other and side edges that connect between said first edge and said second edge, such that the minimum width thereof is at least 70% of the maximum width and the angle between said lower edge and each side edge of said upper portion is at least 70° but no more than 100°.

According to embodiments of the present invention, there is provided a multi-wavelength monolithic semiconductor laser device provided with an AlGaAs compound semiconductor laser element and an InGaAlP compound semiconductor laser element that are formed by using the same substrate, wherein:

said AlGaAs compound semiconductor laser element is a semiconductor laser element comprising:

a first conductive type clad layer;

an active layer formed on said first conductive type clad layer of $Al_yGa_{1-y}As$ (where $0 \leq y \leq 0.2$) for emitting light by current injection;

a second conductive type first clad layer formed on said active layer; and a stripe-shaped second conductive type second clad layer formed of $In_{0.5}(Ga_{1-x}Al_x)_{0.5}P$ (where $0.6 \leq x \leq 1$) in a stripe shape on said second conductive type first clad layer in such a manner that the cross-sectional surface of said stripe-shaped second conductive type second clad layer has a shape having an upper edge and a lower edge that face each other and side edges that connect between said upper edge and said lower edge, where the minimum width thereof is at least 70% but no more than 100% of the maximum width;

and said InGaAlP compound semiconductor laser element is a semiconductor laser element comprising:

a first conductive type clad layer;

an active layer formed on said first conductive type clad layer of $In_{0.5}(Ga_{1-u}Al_u)_{0.5}P$;

a second conductive type first clad layer formed on said active layer; and a stripe-shaped second conductive type second clad layer formed of an InGaAlP compound material of an equivalent composition to that of said stripe-shaped second conductive type second clad layer of said AlGaAs compound semiconductor laser element, said stripe-shaped second conductive type second clad layer formed in a stripe shape on said second conductive type first clad layer, in such a manner that the cross-sectional surface of said stripe-shaped second conductive type second clad layer has a shape having an upper edge and a lower edge that face each other and side edges that connect between said upper edge and said lower edge, where the minimum width thereof is at least 70% but no more than 100% of the maximum width;

wherein said InGaAlP compound semiconductor laser element emits light of a wavelength that differs from that of said AlGaAs compound semiconductor laser element.

Note that the notation $In_{0.5}(Ga_{1-j}Al_j)_{0.5}P$ that is used in this document is assumed to comprise $In_b(Ga_{1-j}Al_j)_{1-b}P$ (where $0.45 \leq b < 0.55$). In other words, it is known in general to substantially match the lattice constant of $In_b(Ga_{1-j}Al_j)_{1-b}P$ to the GaAs substrate, by assuming that the In component b of $In_b(Ga_{1-j}Al_j)_{1-b}P$ is approximately 0.5. Similarly, the notation $In_{0.5}(Ga_{1-j}Al_j)_{0.5}P$ is often used to mean an InGaAlP compound material in which the lattice constant is substantially matched to the GaAs substrate. In this case, the notation $In_{0.5}(Ga_{1-j}Al_j)_{0.5}P$ used in this document refers to an InGaAlP compound material in which the lattice constant is substantially matched to the GaAs substrate, and this is assumed to comprise $In_b(Ga_{1-j}Al_j)_{1-b}P$ (where $0.45 \leq b < 0.55$). In addition, InGaAlP of an equivalent composition in this document is assumed to refer to an InGaAlP compound that matches a composition that has been calculated to the first decimal place.

DETAILED DESCRIPTION OF THE INVENTION

A multi-wavelength monolithic semiconductor laser device and a semiconductor laser element in accordance with embodiments of the present invention are described below with reference to the accompanying figures. One characteristic of these embodiments of the present invention is that the shape of the cross-sectional surfaces of each of the ridge portions 28C and 28D is such that the width of the upper edge is shaped to be at least 70% of the width of the lower edge thereof, and the side edges are close to perpendicular, as can be seen from FIG. 1. This makes it possible to obtain self-sustained pulsation up to a high output level on the order of 6 mW, enabling self-sustained pulsation within a wide output region on the order of 3 to 6 mW. Three embodiments are described below with reference to FIGS. 1 to 5.

FIRST EMBODIMENT

Figure 1:
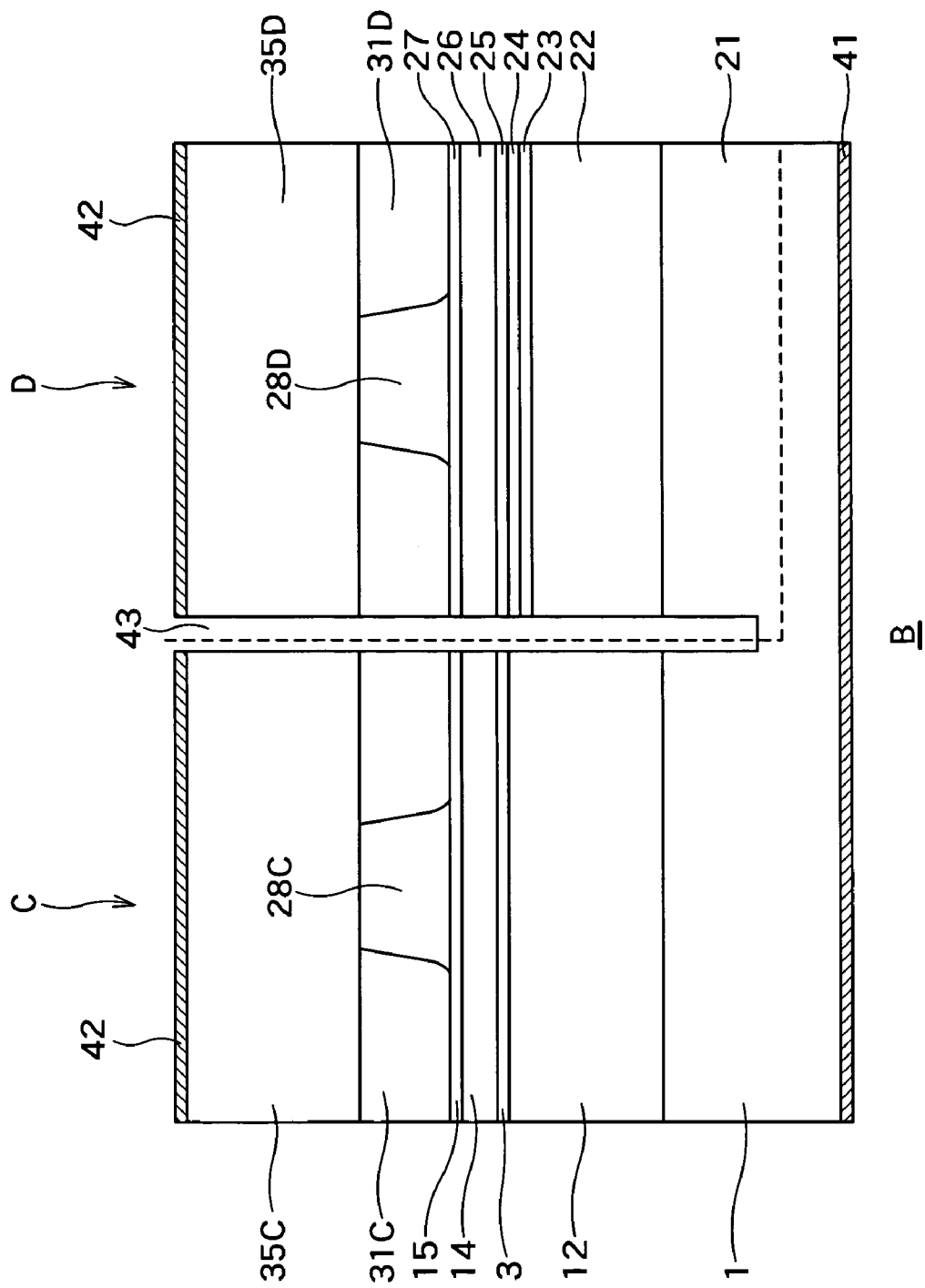
FIG. 1 is a section through a two-wavelength monolithic semiconductor laser device in accordance with a first embodiment of the present invention.

A section through a two-wavelength monolithic semiconductor laser device B in accordance with a first embodiment of this invention is shown in FIG. 1. This two-wavelength monolithic semiconductor laser device B is provided with an AlGaAs compound semiconductor laser element C in which an active layer 3 is formed of an AlGaAs compound material, on the left side of the figure, and an InGaAlP compound semiconductor laser element D in which an active layer 24 is formed of an InGaAlP compound material, on the right side of the figure. The AlGaAs compound semiconductor laser element C on the left side of the figure is for CDs and the InGaAlP compound semiconductor laser element D on the right side of the figure is for DVDs. The element C of CDs is a laser element of the 780 nm-band and the element D for DVDs is a laser element of the 650-nm band. Note that a laser element of the 780-nm band is an element that emits a laser beam of a wavelength of approximately 770 nm to 790 nm, and a laser element of the 650-nm band is an element that emits a laser beam of a wavelength of approximately 630 nm to 700 nm.

The laser element C for CDs on the left side of the figure is formed of an n-type clad layer 12 of $In_{0.5}(Ga_{0.3}Al_{0.7})_{0.5}P$, a 50-nm-thick single-layer active layer 3 of $Al_{0.12}Ga_{0.88}As$, a 0.35-μm-thick p-type (a second conductivity type) first clad layer 14 of $In_{0.5}(Ga_{0.3}Al_{0.7})_{0.5}P$, and an etching-stopping layer 15 of $In_{0.5}Ga_{0.5}P$, formed in sequence on an n-type (a first conductivity type) GaAs substrate. A ridge-shaped (stripe-shaped) p-type second clad layer (ridge portion) 28C is formed of $In_{0.5}(Ga_{0.3}Al_{0.7})_{0.5}P$ in a first direction on this 15 (see FIG. 4). FIG. 1 is a section taken perpendicular to the first direction. The shape in section of this ridge portion 28C is such that it has an upper edge and a lower edge that face each other with side edges connecting them, the width of the upper edge is less than the width of the lower edge, and the side edges have a falling shape such that they widen outwards from the upper-edge sides to the lower-edge sides, as shown in FIG. 1 (see FIG. 3(a) also). Each side edge is such that an upper side edge portion U thereof is at an angle of approximately 80° to the lower edge and a lower side edge portion D thereof is at an angle of less than 80° to the lower edge. In other words, each side edge has a shape that widens towards the lower side. The ridge portion 28C is provided to a thickness of 1 μm in order to efficiently confine light into the active layer 3. A current-blocking layer 31C of n-type InAlP is provided on either side of this ridge portion 28C. A p-type contact layer 35C of GaAs is formed on these current-blocking layers 31C and the ridge portion 28C.

The laser element D for DVDs on the right side of the figure, on the other hand, is formed of a buffer layer 21 of n-type GaAs, an n-type clad layer 22 of $In_{0.5}(Ga_{0.3}Al_{0.7})_{0.5}P$, an n-side guide layer 23 of $In_{0.5}(Ga_{0.5}Al_{0.5})_{0.5}P$, and the active layer 24 containing $In_{0.5}(Ga_{1-u}Al_u)_{0.5}P$ (where $0 \leq u \leq 0.2$), in sequence on the same n-type GaAs substrate 1. This active layer 24 is of a multiple quantum well (MQW) structure of seven alternate layers of 6-nm-thick InGaP well layers and 6-nm-thick InGaAlP barrier layers. A p-side guide layer 25 of $In_{0.5}(Ga_{0.5}Al_{0.5})_{0.5}P$, a 0.35-μm-thick p-type first clad layer 26 of $In_{0.5}(Ga_{0.3}Al_{0.7})_{0.5}P$ and an etching-stopping layer 27 of p-type $In_{0.5}Ga_{0.5}P$ are formed on the active layer 24. A p-type second clad layer (ridge portion) 28D is formed on the etching-stopping layer 27. The ridge portion 28D is formed of an InGaAlP compound material of the same composition of the ridge portion 28C of the AlGaAs compound semiconductor laser element C on the left side of the figure, in other words, of $In_{0.5}(Ga_{0.3}Al_{0.7})_{0.5}P$. The shape of the ridge portion 28D is the same as that of the ridge portion 28C of the AlGaAs compound semiconductor laser element C on the left side of the figure. A current-blocking layer 31D and a p-type contact layer 35D are in common with those of the laser element C for CDs on the left side of the figure. A separation groove 43 is formed between the element D on the right side of the figure and the element C on the left side of the figure.

Currents are injected into the active layer 3 of the element C on the left side of the device B, from an n-side electrode 41 on the lower side in the figure and a p-side electrode 42 on the upper side thereof. Of these, the current from the p-side electrode 42 does not flow into the current-blocking layers 31C and thus is concentrated in the ridge portion 28C. Thus the current from the p-side electrode 42 is injected into the active layer 3 below the ridge portion 28C. This current injection causes the emission of light of a wavelength of 780 nm from the active layer 3 below the ridge portion 28C. This light is amplified to form a laser beam, so that a laser beam of a wavelength of 780 nm is emitted in the direction perpendicular to the plane of the paper. Similarly, a laser beam of a wavelength of 650 nm is emitted from the vicinity of the active layer 24 below the ridge portion 28D of the element D on the right side of the figure, in the direction perpendicular to the plane of the paper. Note that the thickness of the substrate 1 of the element C of FIG. 1 is approximately 100 μm and the thickness of the stack of layers 12 to 35C is a few μm, but these layers are not shown to scale in the elements C and D and the device B, in order to facilitate the description.

One characteristic of the semiconductor laser device B of FIG. 1 is that, in the ridge portions 28C and 28D in which the width of each upper edge is narrow and the width of each lower edge is wide, the ratio of the width of the upper edge to the width of the lower edge has been increased to 80.0%, so that the width of the upper edge is 3.2 μm whereas the width of the lower edge is 4.0 μm. In addition, angle between the lower edge and each side edge of the ridge portions 28C and 28D is such that an upper side edge portion U thereof is close to perpendicular at approximately 80° (see FIG. 3(a)). As will be described later, this upper side edge portion U is formed by dry etching in contrast to a lower edge portion D thereof that is formed by wet etching. Note that the thickness (height) of the ridge portions 28C and 28D is 1 μm. In the device shown in FIG. 1, the ratio of the width of the upper edge to the width of the lower edge of each of these ridge portions 28C and 28D is increased, making it possible to achieve self-sustained pulsation up to a high output of 6 mW. Self-sustained pulsation can be obtained from a lower limit of 3 mW, although there will be some variation between elements. It is therefore possible to obtain self-sustained pulsation within a wide output region on the order of 3 to 6 mW.

The present inventors consider that the reason why self-sustained pulsation can be achieved in such a wide output reason is as follows. In the device of FIG. 1, the width of the upper edge of each of the ridge portions 28C and 28D is increased to 3.2 μm and the side edges of the ridge portions 28C and 28D are close to perpendicular. Thus the current that is injected from each p-side electrode 42 flows through the entire width of the ridge portions 28C and 28D, and the gain is broadened to the entire width under the ridge portions 28C and 28D. This increases the surface area of the portions in which gain is high and decreases the surface area of portions in which absorption occurs. But, since the gain is dispersed over a wide area, the peak strength of the gain is greatly suppressed. The peak strength of the gain is reduced in this way, the absorption effect of the portions of the active layers 3 and 24 under the current-blocking layers 31C and 31D becomes relatively high. As previously described, self-sustained pulsation becomes easier as the likelihood of absorption increases. As a result, it is considered possible to achieve self-sustained pulsation over a wide output region.

However, increasing the ratio of the width of the upper edge to the width of the lower edge in the ridge portions 28C and 28D of a self-sustained pulsation laser and increasing the width of the upper edge of each of the ridge portions 28C and 28D is unthinkable to ordinary engineers. This is because it is thought that increasing the width of the upper edges of the ridge portions 28C and 28D in the prior art will increase the surface area of the portions of the active layers 3 and 24 in which gain is high, making self-sustained pulsation more difficult to achieve. In addition, if the width of the upper edges of the ridge portions 28C and 28D is increased, the ridge portions 28C and 28D are formed by dry etching instead of wet etching, and thus the crystallinity of the ridge portions 28C and 28D will deteriorate. The present inventors, however, have overturned conventional technological wisdom and have independently determined that it is possible to facilitate self-sustained pulsation by increasing the width of the upper edges of the ridge portions 28C and 28D. They have calculated that the advantage of weakening the peak strength of the gain is greater than the disadvantage of increasing the surface area of the portions of the active layers 3 and 24 in which gain is high, so that the absorption effect of the active layers 3 and 24 below the current-blocking layers 31C and 31D is increased relatively. They have also determined that the above-described advantage is greater than the disadvantage due to deterioration of the crystallinity of the ridge portions 28C and 28D.

With the device of FIG. 1, the crystallinity of the ridge portions 28C and 28D does deteriorate slightly, as described above, but the operating voltage can be expected to be similar to that of the conventional device. This has been determined to be due to the increased width of the ridge portions 28C and 28D, which increases the contact surface area between the ridge portions 28C and 28D and the corresponding contact layers 35C and 35D, making it easier for current to flow in those ridge portions.

In addition, the device of FIG. 1 can also be expected to have a lifetime similar to that in the conventional device. This can be assumed to be because the width of the upper edges of the ridge portions 28C and 28D is so wide, the amount of current flowing per unit surface area of the ridge portions 28C and 28D is reduced, and thus the load applied per unit surface area is reduced.

In the AlGaAs compound semiconductor laser element C on the left side of the semiconductor laser device B of FIG. 1, the material properties of the ridge portion 28C are assumed to be similar to the $In_{0.5}(Ga_{0.3}Al_{0.7})_{0.5}P$ of the ridge portion 28D of the InGaAlP compound semiconductor laser element D on the right side of the figure. The current-blocking layer 31C and the p-type contact layer 35C are also common to those of the InGaAlP compound semiconductor laser element D on the right side of the figure. The processing from the formation of the ridge portions 28C and 28D onwards, in other words, the formation of the ridge portions 28C and 28D, the current-blocking layers 31C and 31D, and the p-type contact layers 35C and 35D, can therefore be done simultaneously for the elements C and D on the left and right. This simplifies the fabrication process, enabling increases in mass-productivity and yield.

Figure 8:
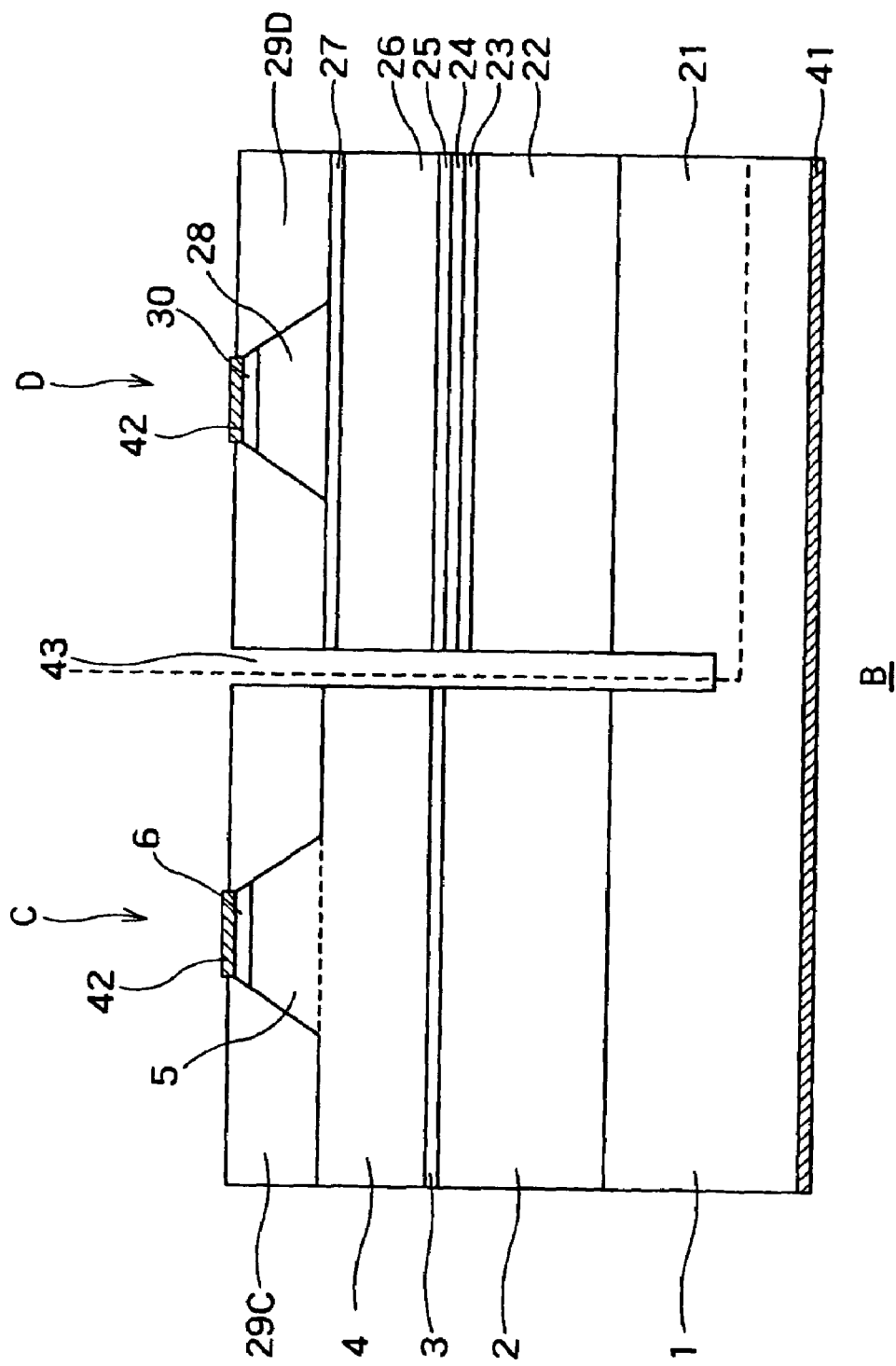
FIG. 8 is a section through a two-wavelength monolithic semiconductor laser device of the prior art.

In contrast thereto, an AlGaAs compound material such as $Al_{0.4}Ga_{0.6}As$ is used for the ridge portion 5 of the AlGaAs compound semiconductor laser element C of the prior art (see FIG. 8). This is thought to be because the use of $In_{0.5}(Ga_{0.3}Al_{0.7})_{0.5}P$ with a high Al content such as that shown in FIG. 1 in the ridge portion 5 will make the band gap difference and refractive index difference between the ridge portion 5 and the active layer 3 too high, leading to mode instability and difficulty in achieving self-sustained pulsation. However, favorable self-sustained pulsation can be achieved in the element C of FIG. 1, as described above. This has been determined to be due to the larger effect of the increased width of the upper edge of the ridge portion 28C, as described above.

Since the active layer 3 of the AlGaAs compound semiconductor laser element C on the left side of the figure in the device B of FIG. 1 is a thick 50 nm, the guide mode is confined into the active layer 3, making absorption likely to occur in the active layer 3 and thus facilitating self-sustained pulsation. Similarly, since the total thickness of the well layers of the active layer 24 in the InGaAlP compound semiconductor laser element D on the right side of the figure in the device B of FIG. 1 is a thick 36 nm, the waveguide mode is sealed into the active layer 24, making absorption likely to occur in the active layer 24 and thus facilitating self-sustained pulsation.

The discussion now turns to an examination of the shape of the ridge portions 28C and 28D of the device B of FIG. 1. In other words, it is assumed that the thickness of each of the ridge portions 28C and 28D is 1.0 μm, the width of the lower edge thereof is 4.0 μm, and the width of the upper edge thereof is 3.2 μm, it is possible to conceive of other shapes and thus such shapes are discussed below.

Figure 2:
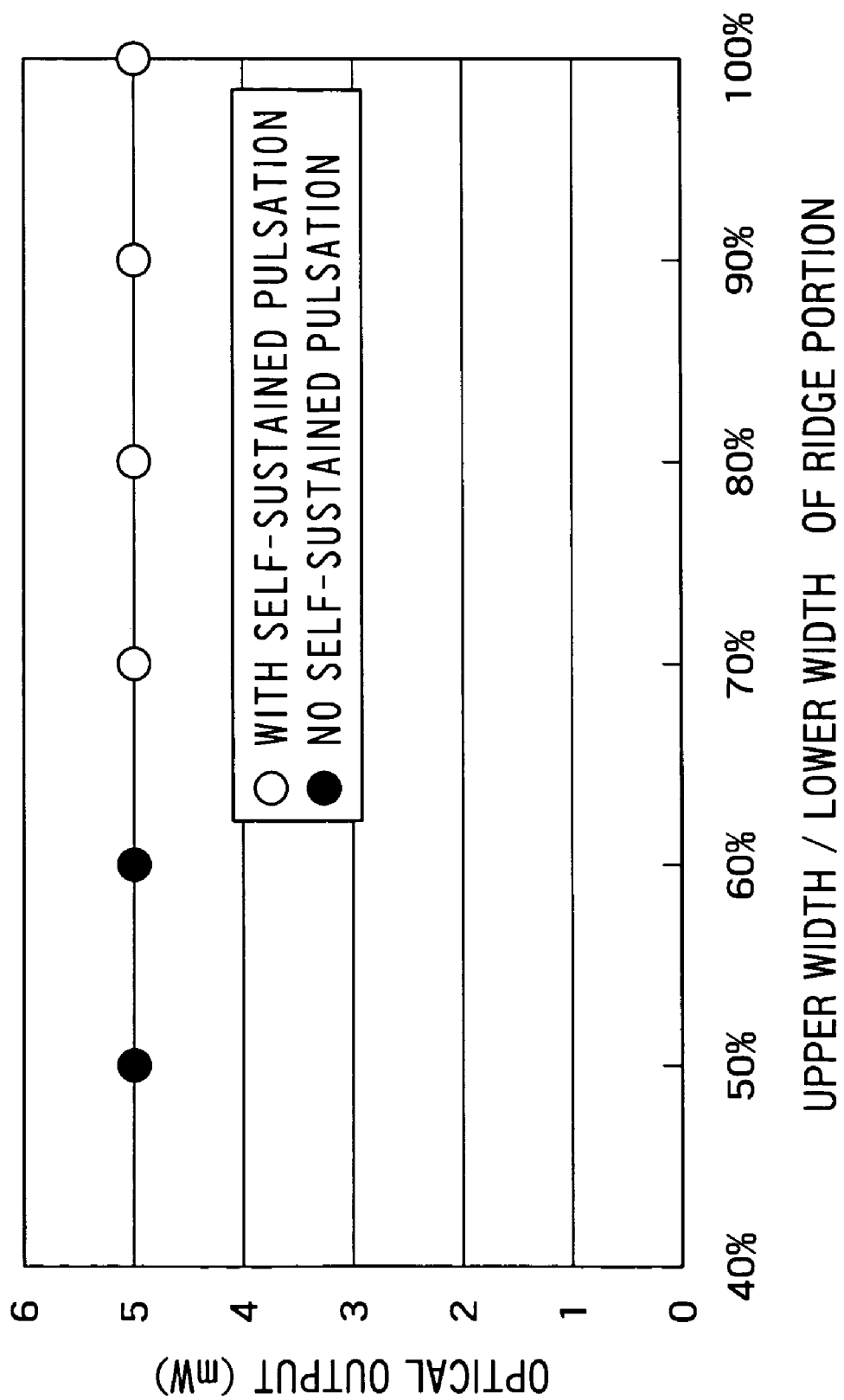
FIG. 2 shows the relationship between the ratio of the upper edge to the width of the lower edge of the ridge portion 28C of the semiconductor laser element C of the two-wavelength monolithic semiconductor laser device B in accordance with the first embodiment of the present invention and the optical output of the laser beam emitted from the active layer 3.
Figure 3:
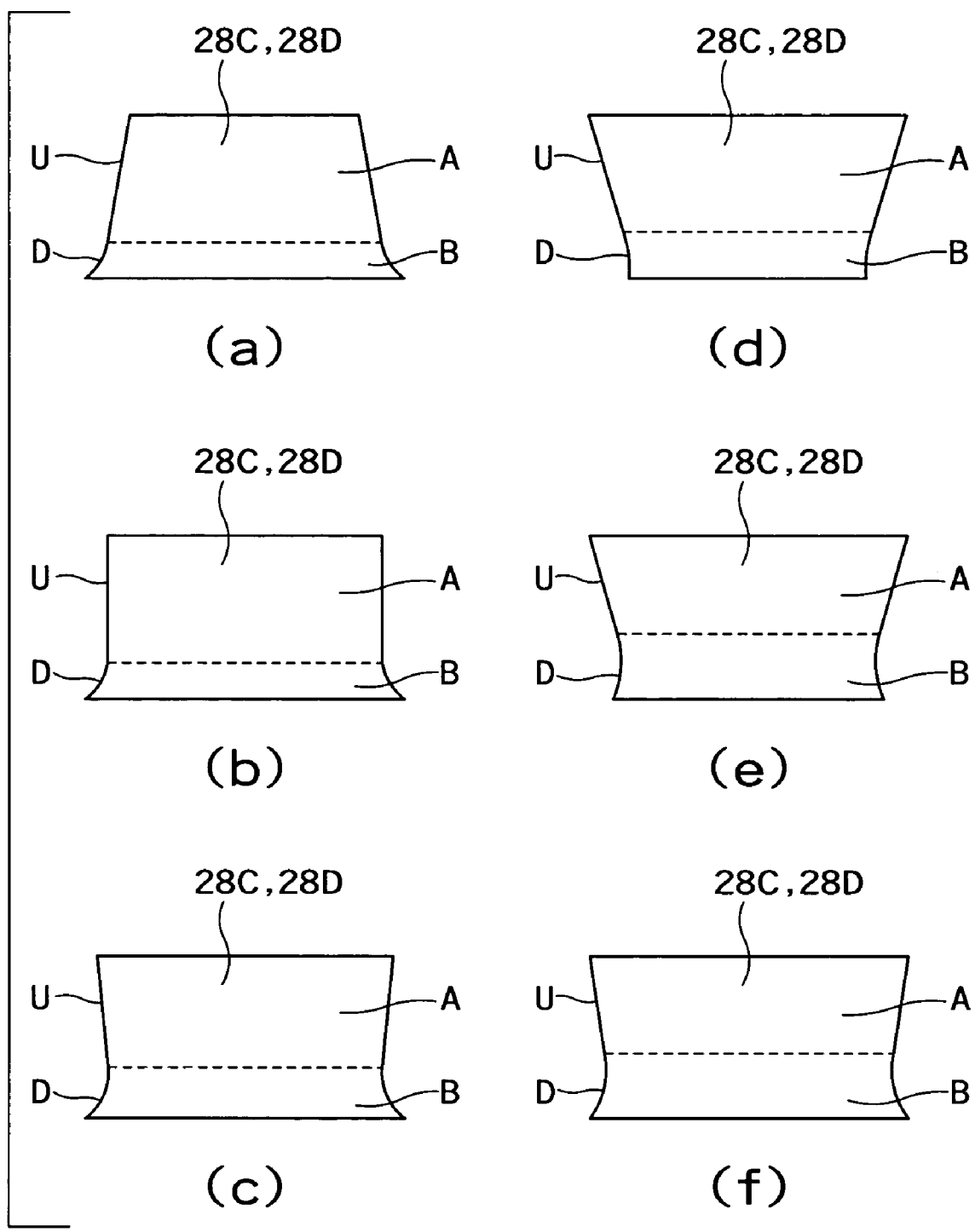
FIG. 3 shows the shapes of the ridge portions 28C and 28D.

The graph shown in FIG. 2 shows the results of simulations and experiments into changes in the width of the upper edge and the occurrence of self-sustained pulsation when the width of the lower edge of the ridge portion 28C in the element C on the left side of the device B of FIG. 1 is 4.0 μm and the thickness thereof is 1 μm. The ratio of the width of the upper edge to the width of the lower edge is plotted along the horizontal axis and the optical output of the laser beam emitted from the active layer 3 is plotted along the vertical axis. It is clear from FIG. 2 that self-sustained pulsation at an output of 5 mW can be achieved if the width of the upper edge of the ridge portion 28C is at least 70% but no more than 100% of the width of the lower edge thereof. It is also clear from the figure that self-sustained pulsation is facilitated if the width of the upper edge of the ridge portion 28C is at least 70% but no more than 100% of the width of the lower edge thereof. Note that the sample in which the width of the upper edge was 100% of the width of the lower edge had substantially perpendicular side edges.

The present inventors then change the width of the lower edge of the ridge portion 28C while the width of the upper edge of the ridge portion 28C was at least 70% but no more than 100% of the width of the lower edge thereof. As a result, it is found that self-sustained pulsation is facilitated when the width of the lower edge is at least 3.0 μm. This is determined to be because the current is concentrated in the central portion of the active layer 3 if the width of the lower edge is less than 3.0 μm, making it difficult for the effect of the present invention to occur. If the width of the lower edge is within the range of no more than 5.0 μm, it is difficult for high-order modes to occur, providing favorable results. In other words, it is more difficult for high-order modes to occur than in the semiconductor laser element of the prior art (see FIG. 8). The reason has been determined to be because if the width of the upper edge is greater than 70% of the width of the lower edge, current flows uniformly throughout the lower side of the ridge portion 28C, making it difficult for high-order modes to occur. Naturally, it becomes easier for those high-order modes to occur when the width of the lower edge is made larger than 5.0 μm. It is clear from the above discussion that favorable results can be obtained when the width of the lower edge is at least 3.0 μm; preferably at least 3.0 μm but no more than 5.0 μm.

The present inventors then perform experiments changing the thickness of the ridge portion 28C and obtained favorable results with a thickness of at least 0.7 μm but no more than 1.4 μm.

The present inventors obtain results that are substantially similar to those for the element C on the left side, from experiments involving changing the shape of the ridge portion 28D of the element D on the right side of the device B of FIG. 1.

It is clear from the above that favorable results are obtained when shapes of the ridge portions 28C and 28D of the elements C and D of the device B of FIG. 1 are such that the width of the upper edge is at least 70% but no more than 100% of the width of the lower edge, the width of the lower edge is at least 3.0 μm but no more than 5.0 μm, and the thickness thereof is at least 0.7 μm but no more than 1.4 μm.

In the above-described laser device of FIG. 1, the cross-sectional surface of each of the ridge portions 28C and 28D is described as having a shape such that the width of the upper edge is less than the width of the lower edge and side edges fall so as to widen outward from the upper edge to the lower edge (see FIG. 3(a)), or a shape such that the width of the upper edge is equal to the width of the lower edge and the side edges are substantially perpendicular from the upper edge side towards the lower edge side. The description also states that the output angle in which self-sustained pulsation occurs is broadened by ensuring that the width of the upper edge is at least 70% but no more than 100% of the width of the lower edge. However, as shown in FIG. 3(b), this cross-section surface can also have a shape such that the width of the upper edge is less than the width of the lower edge and each side edge has an upper side edge portion U which descends substantially perpendicularly from the upper edge towards the lower edge and a lower side edge portion D that extends from the upper edge portion U toward the lower edge, where the width of the upper edge is at least 70% but less than 100% of the width of the lower edge. Similarly, as shown in FIG. 3(c), the cross-sectional surface could have a shape such that the width of the upper edge is less than the width of the lower edge, and each side edge has an upper side edge portion U that descends in a manner that narrows inward from the upper edge towards the lower side edge and a lower edge portion D that extend from that upper edge portion to the lower edge, where the minimum width is at least 70% but less than 100% of the width of the lower edge. Furthermore, as shown in FIG. 3(d), the cross-sectional surface could have a shape such that the width of the upper edge is greater than the width of the lower edge, and each side edge descends in a manner that narrows inward from the upper edge towards the lower edge, where the minimum width of the narrowest portion is at least 70% but less than 100% of the width of the lower edge. In addition, as shown in FIG. 3(e), the cross-sectional surface could have a shape such that the width of the upper edge is greater than the width of the lower edge, and each side edge has an upper side edge portion U that descends in a manner that narrows inward from the upper edge towards the lower edge and a lower side edge portion D that extends from that upper edge portion to the lower edge, where the minimum width is at least 70% but less than 100% of the width of the lower edge. As shown in FIG. 3(f), this cross-sectional surface could also have a shape such that the width of the upper edge is equal to the width of the lower edge, and each side edge has an upper side edge portion U that descends in a manner that narrows inward from the upper edge towards the lower edge and a lower side edge portion D that extends from that upper edge portion to the lower edge, where the minimum width is at least 70% but less than 100% of the width of the lower edge. In each of the above cases, favorable results can be obtained when the width of the lower edge is at least 3.0 μm; preferably at least 3.0 μm but no more than 5.0 μm. In addition, in each of the above case, favorable results can be obtained when the angle between the upper edge portion U of each of the ridge portions 28C and 28D and the lower edge is at least 70° but no more than 100° from the viewpoint of the fabrication method that will be described below.

In the laser device B of FIG. 1, a single layer of $Al_{0.12}Ga_{0.88}As$ of a thickness of 50 nm was used as the active layer 3 of the AlGaAs compound semiconductor laser element C on the left side of the figure. However, this active layer 3 could also be formed of a single layer of $Al_yGa_{1-y}As$ (where $0 \leq y \leq 0.2$) of a thickness of at least 20 nm but no more than 60 nm. Such a configuration facilitates the occurrence of self-sustained pulsation. Furthermore, the active layer 3 could comprise $Al_yGa_{1-y}As$ (where $0 \leq y \leq 0.2$).

In the laser device B of FIG. 1, a multiple quantum well (MQW) structure of seven alternate layers of 6-nm-thick InGaP well layers and 6-nm-thick InGaAlP barrier layers is used as the active layer 24 of the InGaAlP compound semiconductor laser element D on the right side of the figure. However, this active layer 24 could have a multiple quantum well structure formed of a stack of at least five but no more than nine alternate layers of well layers of $In_{0.5}(Ga_{1-u}Al_u)_{0.5}P$ (where $0 \leq u \leq 0.2$) and barrier layers of $In_{0.5}(Ga_{1-v}Al_v)_{0.5}P$ (where $0.2 < v \leq 0.6$). And each well layer could have a thickness of at least 4 nm but no more than 8 nm. Such a configuration facilitates the occurrence of self-sustained pulsation. Further, the active layer 24 could comprise $In_{0.5}(Ga_{1-u}Al_u)_{0.5}P$ (where $0 \leq u \leq 0.2$). Furthermore, it can be considered that the layers 23, 24 and 25 comprise an active layer.

In the laser device B of FIG. 1, the thickness of the p-type first clad layers 14 and 26 is 0.35 nm, but it could also be at least 0.15 μm but no more than 0.45 μm; preferably at least 0.30 μm but no more than 0.40 μm. If the p-type first clad layers 14 and 26 are too thin, the likelihood of the generation of lateral high-order modes increases. If they are too thick, the spread of current in the lateral direction increases, facilitating an increase in the threshold voltage.

In the laser device B of FIG. 1, the p-type first clad layers 14 and 26 are formed of $In_{0.5}(Ga_{0.3}Al_{0.7})_{0.5}P$ but they could equally well be formed of $In_{0.5}(Ga_{1-t}Al_t)_{0.5}P$ (where $0.6 \leq t \leq 1$).

In the laser device B of FIG. 1, the stripe-shaped second conductive type second clad layers 28C and 28D are formed of $In_{0.5}(Ga_{0.3}Al_{0.7})_{0.5}P$, but they could equally well be formed of $In_{0.5}(Ga_{1-x}Al_x)_{0.5}P$ (where $0.6 \leq x \leq 1$).

In the laser device B of FIG. 1, the current-blocking layers 31C and 31D are formed of $In_{0.5}Al_{0.5}P$, but they could equally well be formed of $In_{0.5}(Ga_{1-w}Al_w)_{0.5}P$ (where $0.7 \leq w \leq 1.0$).

The description now turns to a method of fabricating the semiconductor laser device B of FIG. 1. One characteristic of the device of FIG. 1 is the way in which dry etching is used to shape the ridge portions 28C and 28D. Since the material properties of the ridge portions 28C and 28D are the same for the elements on the left and right sides, the processing from the formation of the ridge portions 28C and 28D onwards can be done simultaneously.

(1) First of all, the n-type clad layer 12 of $In_{0.5}(Ga_{0.3}Al_{0.7})_{0.5}P$, the active layer 3 of $Al_{0.12}Ga_{0.88}As$, the p-type first clad layer 14 of $In_{0.5}(Ga_{0.3}Al_{0.7})_{0.5}P$, the etching-stopping layer 15 of $In_{0.5}Ga_{0.5}P$, and a p-type second clad layer 28C'. (which will later be turned into the ridge portion 28C by etching) of $In_{0.5}(Ga_{0.3}Al_{0.7})_{0.5}P$ are grown in that sequence on the n-type GaAs substrate 1.

(2) An oxide film is then formed over the entire upper surface, the oxide film is removed from the portion on the right half of FIG. 1, and the portion delimited by the broken line in the figure is etched away as far as partway down the n-type GaAs substrate 1. The stack of layers 21 to 27 of InGaAlP compound materials and a p-type second clad layer 28D' (which will later be turned into the ridge portion 28D by etching) of $In_{0.5}(Ga_{0.3}Al_{0.7})_{0.5}P$ of a thickness of 1 μm are then grown by a second crystal growth process on the etched portion.

(3) A stripe-shaped oxide film is then formed on the p-type second clad layers 28C' and 28D' on the left and right sides.

(4) This oxide film is used as a mask to etch the p-type second clad layers 28C' and 28D' and form the stripe-shaped p-type second clad layers (ridge portions) 28C and 28D. More specifically, the upper side edge portion U of an upper portion A of each of the portions 28C and 28D is formed by dry etching and the lower side edge portion D of a lower portion B thereof is formed by wet etching, as is clear from FIG. 3(a). That is, during the etching of the p-type second clad layers 28C' and 28D' by dry etching, it is difficult to stop the etching in the depthwise direction to a high precision on top of the etching-stopping layers 15 and 27. In contrast thereto, the difference in etching speed between the p-type second clad layers 28C' and 28D' and the etching-stopping layers 15 and 27 can be utilized in wet etching to stop the etching with a high degree of precision on top of the etching-stopping layers 15 and 27. In this case, dry etching and wet etching can be used together to increase the precision of the depth of etching, by forming the lower portion B by wet etching.

(5) Both sides of each of the ridge portions 28C and 28D are then buried in the current-blocking layers 31C and 31D formed of n-type InAlP. After the above-described stripe-shaped oxide films have been removed, the GaAs contact layers 35C and 35D are then grown on the corresponding ridge portions 28C and 28D and current-blocking layers 31C and 31D.

(6) Then, the p-side electrodes 42 and the n-side electrode 41 have been formed. After this, the separation groove 43 is formed by reactive ion etching (RIE), making it possible to obtain the desired two-wavelength monolithic semiconductor laser device.

In the above-described method of fabricating the semiconductor laser device B of FIG. 1, the composition of the ridge portions 28C and 28D of the elements C and D on the left and right of the figure have the same composition so the ridge portions 28C and 28D can be formed simultaneously. This simplifies the fabrication process, enabling increases in mass-productivity and yield.

Since dry etching is used in the formation of the upper portion A of each of the ridge portions 28C and 28D in this method of fabricating the semiconductor laser elements C and D of FIG. 1, the side edges of the ridge portions 28C and 28D can be processed to a shape that is close to perpendicular. This makes it possible to process them to a shape that enables the width of the upper edge to be at least 70% of the width of the lower edge.

In the description above of the method of fabricating semiconductor laser elements, the shape of the ridge portions 28C and 28D is assumed to be that as shown in FIG. 3(a), but it is equally possible to use similar methods to form the ridge portions 28C and 28D to any of the shapes shown in FIGS. 3(b) to 3(f). It should be noted, however, that it is preferable that each upper portion A formed by dry etching covers at least 60% of the tops of the ridge portions 28C and 28D, to ensure that the minimum width is at least 70% of the maximum width. It is also preferable that the angle between the upper side edge portion U of each upper portion A and the lower edge is at least 70° but no more than 100°.

SECOND EMBODIMENT

Figure 4:
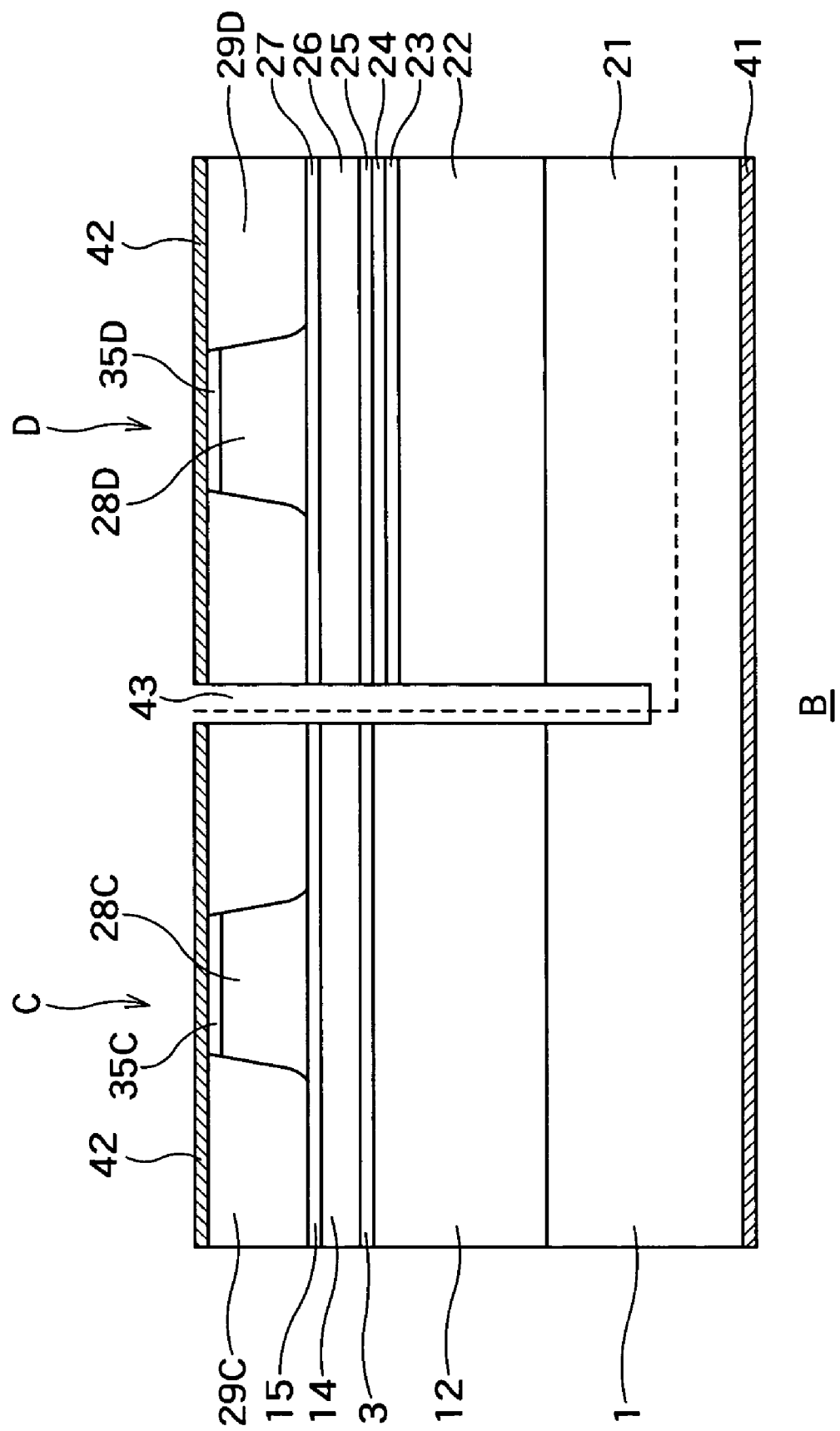
FIG. 4 is a section through a two-wavelength monolithic semiconductor laser device in accordance with a second embodiment of the present invention.

A section through a two-wavelength monolithic semiconductor laser device B in accordance with a second embodiment of the present invention is shown in FIG. 4. This device differs from the device of the first embodiment (shown in FIG. 1) in that dielectric isolation films 29C and 29D of $SiO_2$ are formed to sandwich both sides of the corresponding ridge portions 28C and 28D and the GaAs contact layers 35C and 35D are formed in stripe shapes on the corresponding ridge portions 28C and 28D. The material properties of the dielectric isolation films 29C and 29D and the GaAs contact layers 35C and 35D are the same for the elements C and D on the left and right.

Since the dielectric isolation films 29C and 29D of $SiO_2$ have a refractive index that is lower than that of InAlP, and thus it is difficult to broaden the guide mode, it is possible to broaden the guide mode and induce self-sustained pulsation by controlling the thicknesses of the p-type first clad layers 14 and 26.

THIRD EMBODIMENT

Figure 5:
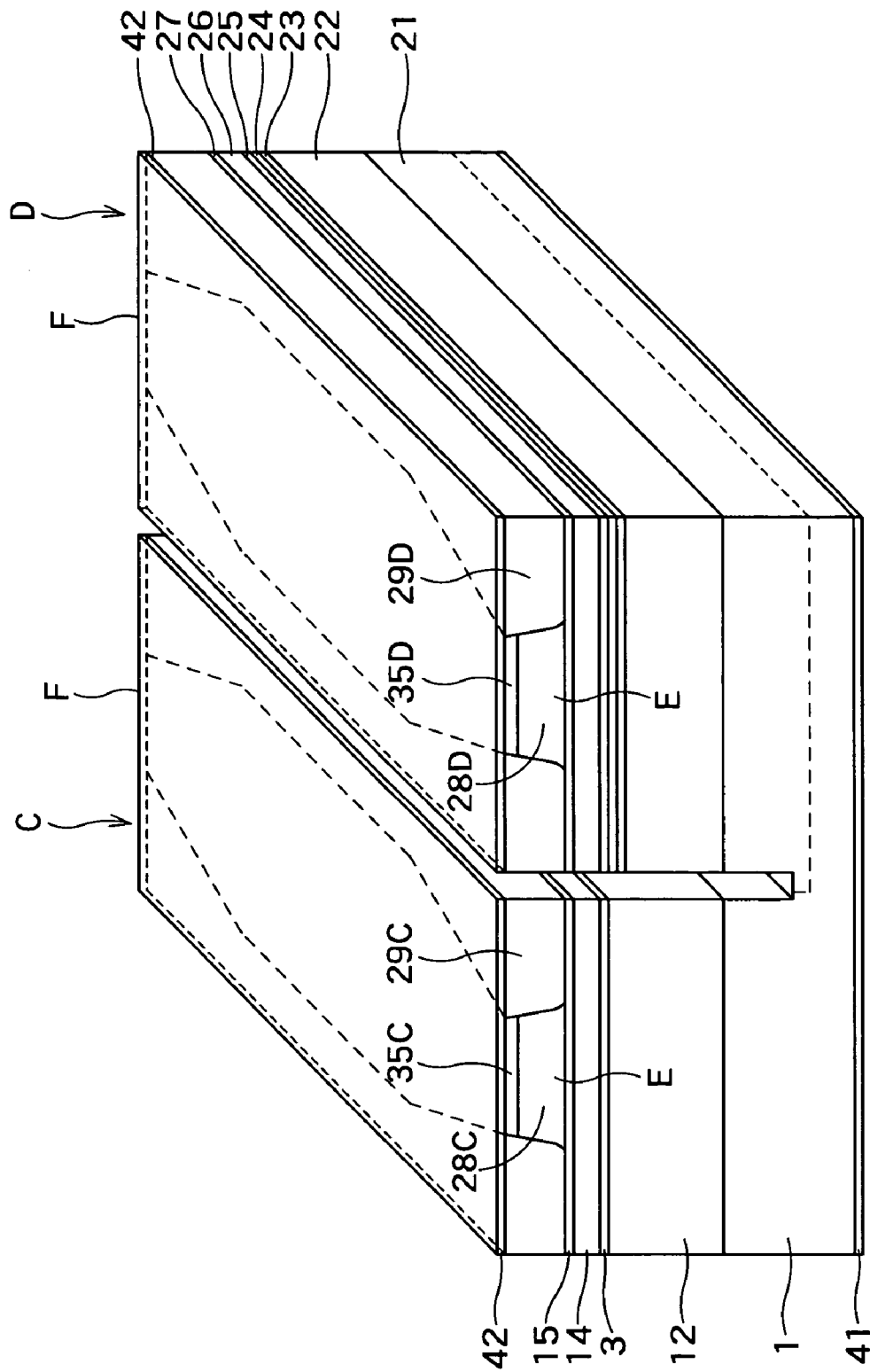
FIG. 5 is a perspective view of a two-wavelength monolithic semiconductor laser device in accordance with a third embodiment of the present invention.

A perspective view of a two-wavelength monolithic semiconductor laser device B in accordance with a third embodiment of the present invention is shown in FIG. 5. This device differs from the device of the second embodiment (shown in FIG. 4) in that the stripe-shaped second conductive type second semiconductor layers 28C and 28D and the GaAs contact layers are formed to be wider at a central portion between an end surface E at the nearer end and an end surface F at a farther end, and narrower in the vicinity of the end surfaces. It is possible to narrow the guide mode in the lateral direction in the vicinity of the end surfaces and increase the angle of emission of the thus-emitted laser beam in the lateral direction by widening the central portions of the stripe-shaped second conductive type second semiconductor layers 28C and 28D, as shown in FIG. 5. Note that if the width of the stripe-shaped second conductive type second semiconductor layers 28C and 28D in the vicinity of the end surfaces is no more than 5.0 µm, there is no increase in the likelihood of the generation of high-order mode, irrespective of the width of the central portions thereof.

FOURTH EMBODIMENT

Figure 6:
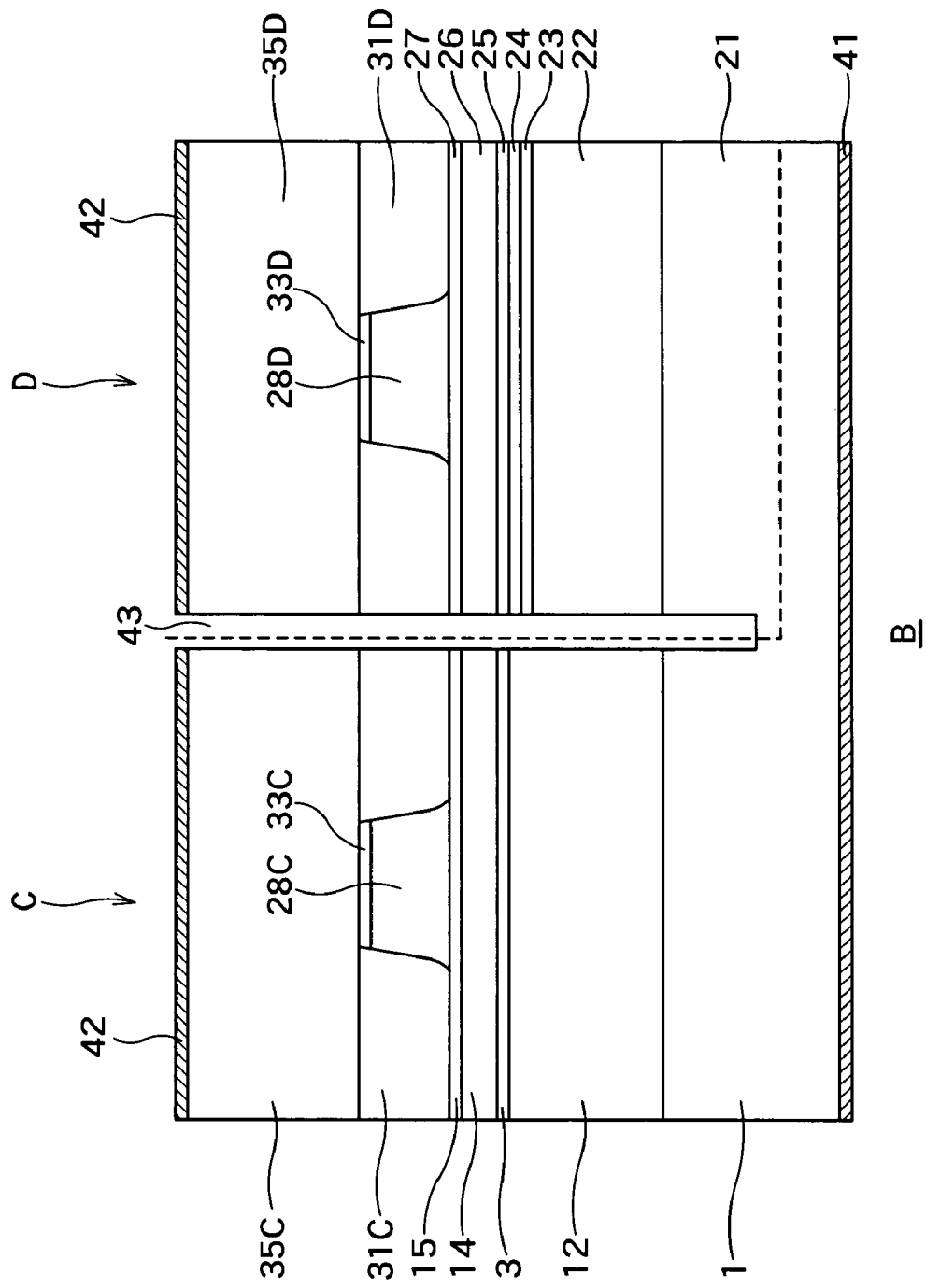
FIG. 6 is a section through a two-wavelength monolithic semiconductor laser device in accordance with a fourth embodiment of the present invention.

A section through a two-wavelength monolithic semiconductor laser device B in accordance with a fourth embodiment of the present invention is shown in FIG. 6. This device differs from the device of the first embodiment (shown in FIG. 1) in that InGaP medium layer 33C and 33D are formed on the ridge portions 28C and 28D. The InGaP medium layer 33C and 33D are formed between ridge portions 28C and 28D and the GaAs contact layers 35C and 35D. Provision of such InGaP medium layer 33C and 33D make it easier for flowing current from GaAs contact layers 35C and 35D to ridge portions 28C and 28D.

FIFTH EMBODIMENT

Figure 7:
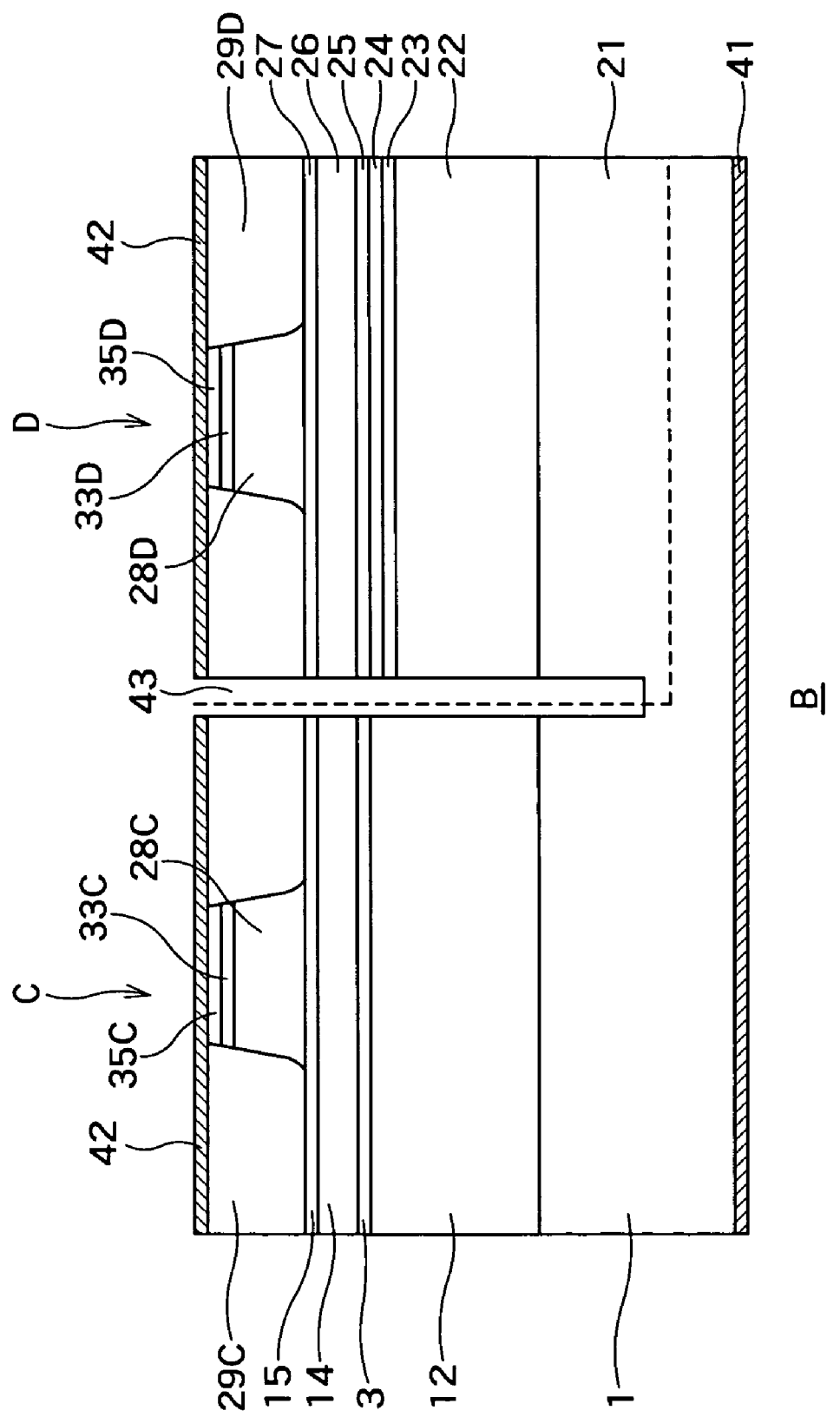
FIG. 7 is a section through a two-wavelength monolithic semiconductor laser device in accordance with a fifth embodiment of the present invention.

A section through a two-wavelength monolithic semiconductor laser device B in accordance with a fifth embodiment of the present invention is shown in FIG. 7. This device differs from the device of the second embodiment (shown in FIG. 4) in that InGaP medium layer 33C and 33D are formed between ridge portions 28C and 28D and the GaAs contact layers 35C and 35D. Provision of such InGaP medium layer 33C and 33D make it easier for flowing current from GaAs contact layers 35C and 35D to ridge portions 28C and 28D.

Additional advantages and modifications will readily occur to those skilled in the art. Therefore, the invention in its broader aspects is not limited to the specific details and representative embodiments shown and described herein. Accordingly, various modifications may be made without departing from the spirit or scope of general inventive concept as defined by the appended claims and their equivalents.

What is claimed is:

1. A semiconductor laser element that exhibits self-sustained pulsation in a predetermined output region, said semiconductor laser element comprising:

a substrate;

a first conductive type clad layer formed on said substrate;

an active layer formed on said first conductive type clad layer for emitting light by current injection;

a second conductive type first clad layer formed on said active layer; and a stripe-shaped second conductive type second clad layer formed on said second conductive type first clad layer in a first direction, in such a manner that the cross-sectional surface of said stripe-shaped second conductive type second clad layer in a direction perpendicular to said first direction has a share having an upper edge and a lower edge that face each other and side edges that connect between said upper edge and said lower edge, where the minimum width thereof is at least 70% but no more than 100% of the maximum width, wherein the angle between each of said side edges and said lower edge of said stripe-shaped second conductive type second clad layer is at least 70° but no more than 100° at a portion that is at least 60% of the upper side of said stripe-shaped second conductive type second clad layer, and wherein the shape of said cross-sectional surface of said stripe-shaped second conductive type second clad layer is any one of the following:

a shape such that the width of said upper edge is greater than the width of said lower edge, and each of said side edges narrows inward from said upper edge to said lower edge; and a shape such that the width of said upper edge is greater than the width of said lower edge, and each of said side edges has an upper side edge portion that descends in a manner that narrows inward from said upper edge towards said lower edge and a lower side edge portion that extends from that upper edge portion to said lower edge.

2. A semiconductor laser element that exhibits self-sustained pulsation in a predetermined output region, said semiconductor laser element comprising:

a substrate;

a first conductive type clad layer formed on said substrate;

an active layer formed on said first conductive type clad layer for emitting light by current injection;

a second conductive type first clad layer formed on said active layer; and a stripe-shaped second conductive type second clad layer formed on said second conductive type first clad layer in a first direction, in such a manner that the cross-sectional surface of said stripe-shaped second conductive type second clad layer in a direction perpendicular to said first direction has a share having an upper edge and a lower edge that face each other and side edges that connect between said upper edge and said lower edge, where the minimum width thereof is at least 70% but no more than 100% of the maximum width, wherein the angle between each of said side edges and said lower edge of said stripe-shaped second conductive type second clad layer is at least 70° but no more than 100° at a portion that is at least 60% of the upper side of said stripe-shaped second conductive type second clad layer, and wherein said cross-sectional surface of said stripe-shaped second conductive type second clad layer has a shape such that the width of said upper edge is equal to the width of said lower edge, and each of said side edges has an upper side edge portion that descends in a manner that narrows inward from said upper edge towards said lower edge and a lower side edge portion that extends from that upper edge portion to said lower edge.

* * * * *